United States Patent
More

(10) Patent No.: US 12,170,335 B2
(45) Date of Patent: Dec. 17, 2024

(54) EPITAXIAL STRUCTURES FOR SEMICONDUCTOR DEVICES

(71) Applicant: Taiwan Semiconductor Manufacturing Co., Ltd., Hsinchu (TW)

(72) Inventor: Shahaji B. More, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 18/174,831

(22) Filed: Feb. 27, 2023

(65) Prior Publication Data

US 2023/0215951 A1    Jul. 6, 2023

Related U.S. Application Data

(63) Continuation of application No. 17/146,581, filed on Jan. 12, 2021, now Pat. No. 11,594,638.
(Continued)

(51) Int. Cl.
*H01L 29/786* (2006.01)
*H01L 21/02* (2006.01)
(Continued)

(52) U.S. Cl.
CPC .. *H01L 29/78618* (2013.01); *H01L 21/02532* (2013.01); *H01L 21/02603* (2013.01);
(Continued)

(58) Field of Classification Search
CPC ......... H01L 29/78618; H01L 21/02532; H01L 21/02603; H01L 21/26513; H01L 21/28518; H01L 29/0673; H01L 29/42392; H01L 29/45; H01L 29/66553; H01L 29/66742; H01L 29/78696; H01L 29/0847; H01L 29/66439; H01L 21/0243; H01L 21/02576; H01L 21/02579;
(Continued)

(56) References Cited

U.S. PATENT DOCUMENTS

| 10,680,106 B2 | 6/2020 | More et al. |
| 11,075,269 B2 | 7/2021 | Peng et al. |

(Continued)

FOREIGN PATENT DOCUMENTS

| CN | 105280704 A | 1/2016 |
| CN | 110957221 A | 4/2020 |

(Continued)

*Primary Examiner* — Tong-Ho Kim
(74) *Attorney, Agent, or Firm* — Sterne, Kessler, Goldstein & Fox P.L.L.C.

(57) ABSTRACT

The present disclosure describes a semiconductor device and methods for forming the same. The semiconductor device includes nanostructures on a substrate and a source/drain region in contact with the nanostructures. The source/drain region includes epitaxial end caps, where each epitaxial end cap is formed at an end portion of a nanostructure of the nanostructures. The source/drain region also includes an epitaxial body in contact with the epitaxial end caps and an epitaxial top cap formed on the epitaxial body. The semiconductor device further includes gate structure formed on the nanostructures.

20 Claims, 13 Drawing Sheets

Related U.S. Application Data

(60) Provisional application No. 63/065,686, filed on Aug. 14, 2020.

(51) Int. Cl.
*H01L 21/265* (2006.01)
*H01L 21/285* (2006.01)
*H01L 29/06* (2006.01)
*H01L 29/423* (2006.01)
*H01L 29/45* (2006.01)
*H01L 29/66* (2006.01)

(52) U.S. Cl.
CPC .. *H01L 21/26513* (2013.01); *H01L 21/28518* (2013.01); *H01L 29/0673* (2013.01); *H01L 29/42392* (2013.01); *H01L 29/45* (2013.01); *H01L 29/66553* (2013.01); *H01L 29/66742* (2013.01); *H01L 29/78696* (2013.01)

(58) Field of Classification Search
CPC ......... H01L 21/02639; H01L 21/76843; H01L 21/76855; H01L 21/823425; H01L 27/088; H01L 29/1079; H01L 29/775; H01L 29/161; H01L 29/165; H01L 29/7848; H01L 29/665; H01L 29/66545; H01L 27/0886; H01L 21/823418; H01L 21/823431; H01L 21/823814; H01L 21/823821; H01L 27/0924; H01L 21/823412; H01L 21/823437; H01L 21/823462; B82Y 10/00
USPC .......................................................... 257/347
See application file for complete search history.

(56) References Cited

U.S. PATENT DOCUMENTS

| | | | |
|---|---|---|---|
| 11,594,638 B2* | 2/2023 | More | H01L 29/0673 |
| 2015/0364580 A1 | 12/2015 | Jangjian et al. | |
| 2015/0372142 A1 | 12/2015 | Kuang et al. | |
| 2019/0148551 A1 | 5/2019 | More et al. | |
| 2020/0006560 A1 | 1/2020 | Singh et al. | |
| 2020/0020774 A1 | 1/2020 | Lee et al. | |
| 2020/0105934 A1 | 4/2020 | Ma et al. | |
| 2020/0220018 A1* | 7/2020 | Jang | H01L 29/0847 |
| 2020/0251593 A1 | 8/2020 | Miao et al. | |
| 2020/0365692 A1* | 11/2020 | Jung | H01L 29/785 |
| 2021/0234047 A1 | 7/2021 | Tsai et al. | |
| 2022/0052203 A1 | 2/2022 | More | |

FOREIGN PATENT DOCUMENTS

| | | |
|---|---|---|
| KR | 20200066561 A | 6/2020 |
| KR | 20200086606 A | 7/2020 |
| KR | 20200086607 A | 7/2020 |

* cited by examiner

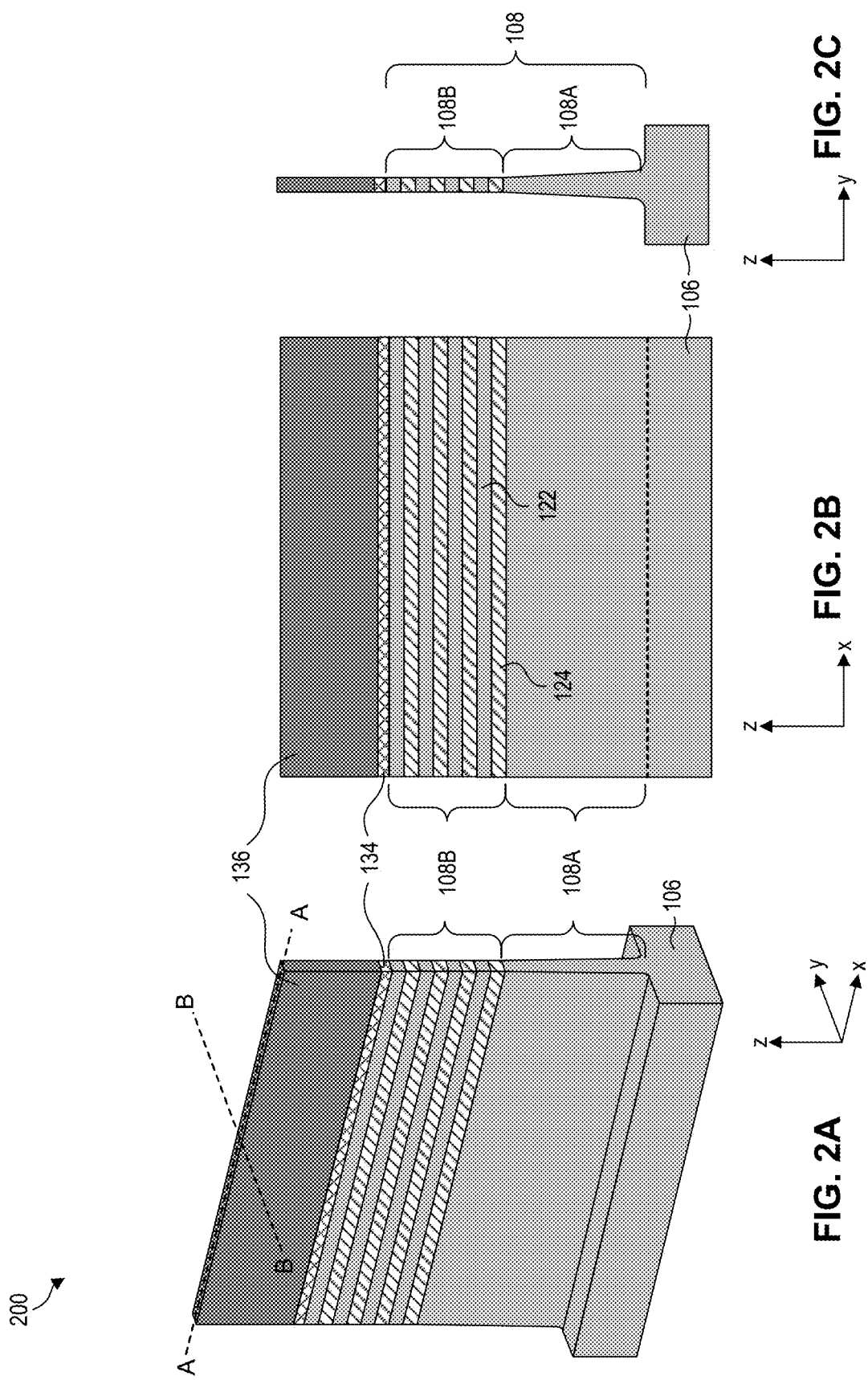

EPITAXIAL STRUCTURES FOR SEMICONDUCTOR DEVICES

CROSS-REFERENCE TO RELATED APPLICATIONS

This application is a continuation of U.S. patent application Ser. No. 17/146,581, titled "Epitaxial Structures for Semiconductor Devices," filed Jan. 12, 2021, which claims the benefit of U.S. Provisional Patent Application No. 63/065,686, titled "Epitaxial Structures for Gate-All Around (GAA) Devices," filed Aug. 14, 2020, each of which is incorporated herein by reference in its entirety.

BACKGROUND

With advances in semiconductor technology, there has been increasing demand for higher storage capacity, faster processing systems, higher performance, and lower costs. To meet these demands, the semiconductor industry continues to scale down the dimensions of semiconductor devices and three-dimensional transistors, such as gate-all-around (GAA) field effect transistors and fin field effect transistors (finFETs), are introduced.

BRIEF DESCRIPTION OF THE DRAWINGS

Aspects of this disclosure are best understood from the following detailed description when read with the accompanying figures. It is noted that, in accordance with the common practice in the industry, various features are not drawn to scale. In fact, the dimensions of the various features may be arbitrarily increased or reduced for clarity of discussion.

FIGS. 2A-2C, 3A, 3B, and 4-9 illustrate various cross-sectional views of semiconductor devices at various stages of their fabrication process, in accordance with some embodiments.

Illustrative embodiments will now be described with reference to the accompanying drawings. In the drawings, like reference numerals generally indicate identical, functionally similar, and/or structurally similar elements.

DETAILED DESCRIPTION

Figure 1:
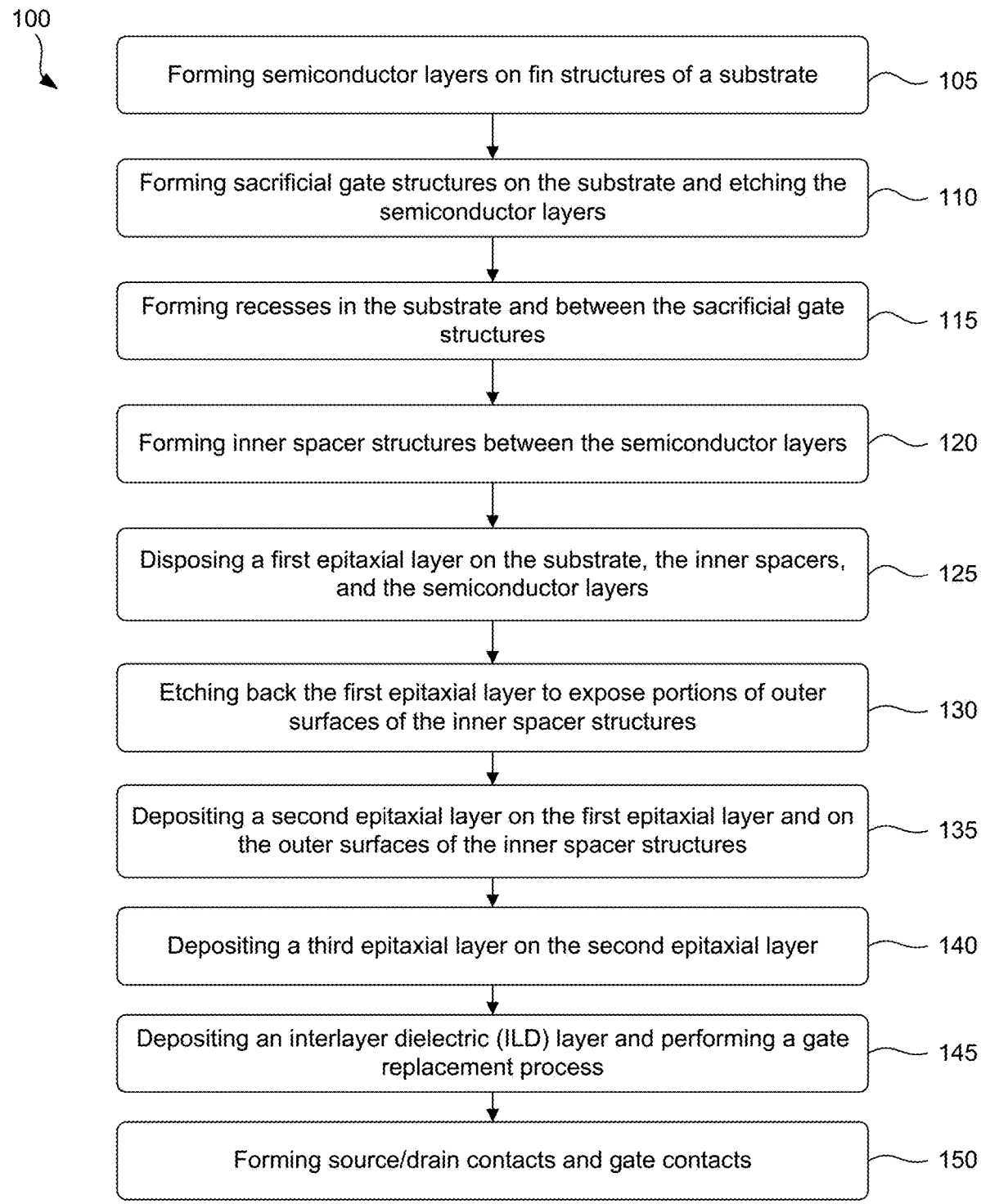
FIG. 1 is a flow diagram of a method for fabricating multi-layer epitaxial source/drain structures in semiconductor devices, in accordance with some embodiments.

The following disclosure provides different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features are disposed between the first and second features, such that the first and second features are not in direct contact. In addition, the present disclosure may repeat reference numerals and/or letters in the various examples. This repetition does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The acronym "FET," as used herein, refers to a field effect transistor. An example of a FET is a metal oxide semiconductor field effect transistor (MOSFET). MOSFETs can be, for example, (i) planar structures built in and on the planar surface of a substrate, such as a semiconductor wafer, or (ii) built with vertical structures.

The term "FinFET" refers to a FET formed over a fin that is vertically oriented with respect to the planar surface of a wafer.

"S/D" refers to the source and/or drain junctions that form two terminals of a FET.

The term "vertical," as used herein, means nominally perpendicular to the surface of a substrate.

The term "nominal" as used herein refers to a desired, or target, value of a characteristic or parameter for a component or a process operation, set during the design phase of a product or a process, together with a range of values above and/or below the desired value. The range of values is typically due to slight variations in manufacturing processes or tolerances.

The terms "about" and "substantially" as used herein indicate the value of a given quantity that can vary based on a particular technology node associated with the subject semiconductor device. In some embodiments, based on the particular technology node, the terms "about" and "substantially" can indicate a value of a given quantity that varies within, for example, 5% of the value (e.g., ±1%, ±2%, ±3%, ±4%, ±5% of the value), 10% of the value, 20% of the value, etc.

The terms "vertical direction" and "horizontal direction" respectively refer to z-direction and x-direction as illustrated in the figures herein.

The present disclosure provides example field effective transistor (FET) devices (e.g., gate-all-around (GAA) FETs, fin-type FET (finFETs), horizontal or vertical GAA finFETs, or planar FETs) in a semiconductor device and/or in an integrated circuit (IC) and example methods for fabricating the same.

Epitaxially grown materials are implemented in semiconductor devices to increase device speed and reduce device power consumption. For example, source/drain terminals of transistor devices formed of doped epitaxial materials can provide benefits, such as enhanced carrier mobility and improved device performance. Epitaxial source/drain terminals can be formed by epitaxially disposing crystalline material on a substrate. As the semiconductor industry continues to scale down the dimensions of semiconductor devices, circuit complexity has increased at all device levels. For example, beyond the 5 nm technology node or the 3 nm technology node, increased source/drain tunneling can increase leakage current. Short channel effects can also be one of the reasons for device failure. Semiconductor devices implementing nanostructures, such as nanowires, are potential candidates to overcome the short channel effects. Among them, GAA transistor devices can reduce short channel effects and enhance carrier mobility, which in turn improve device performance. However, it has become increasingly challenging to dispose epitaxial material in high aspect ratio openings of GAA devices for forming source/drain terminals, without forming defects in the deposited material. Defects, such as voids and clustering formed in the source/drain structures, can impact device performance and reduce device yield.

Various embodiments in the present disclosure describe methods for forming void-free epitaxial source/drain structures. For example, a multi-step epitaxial source/drain formation process can be used in forming source/drain structures for GAAFETs. In some embodiments, the GAAFETs can implement nanowires or nanosheet structures with spacers formed between adjacent nanowires or nanosheets. The multi-step epitaxial source/drain formation process can include forming epitaxial end caps around end portions of the nanowires or nanosheets in order to reduce defects and prevent short channel effects. Additional epitaxial materials are disposed on the epitaxial end caps and spacers until the bulk of source/drain structures are formed. An epitaxial cap layer can be formed on the top surface of the additional epitaxial materials for reducing contact resistance between the source/drain structure and subsequently formed source/drain contacts. Multi-step epitaxial source/drain structures described herein provide various benefits that can improve device performance, reliability, and yield. Benefits can include, but are not limited to, reduced short channel effects, reduced voids, and reduced defects, among other things. The embodiments described herein use GAAFETs as examples and can be applied to other semiconductor structures, such as finFETs and planar FETs. In addition, the embodiments described herein can be used in various technology nodes, such as 14 nm, 7 nm, 5 nm, 3 nm, 2 nm, and lower technology nodes.

FIG. 1 is a flow diagram of a method 100 for fabricating a semiconductor device incorporating multi-layer epitaxial source/drain structures, according to some embodiments. For illustrative purposes, the operations illustrated in FIG. 1 will be described with reference to the example fabrication process of fabricating semiconductor device 200 as illustrated in FIGS. 2A-2C, 3A, 3B, and 4-12. Operations can be performed in a different order or not performed depending on specific applications. It should be noted that method 100 may not produce a complete semiconductor device. Accordingly, it is understood that additional processes can be provided before, during, and after method 100, and that some other processes may only be briefly described herein.

Referring to FIG. 1, in operation 105, semiconductor layers are formed on fin structures of a substrate, according to some embodiments. For example, fin structure 108 with fin base portion 108A and fin top portion 108B can be formed on substrate 106 as described with reference to semiconductor device 200 illustrated in FIGS. 2A-2C. FIG. 2B is a cross-sectional view of the structure in FIG. 2A as viewed from the A-A line. FIG. 2C is a cross-sectional view of the structure in FIG. 2A as viewed from the B-B line. The formation of fin structure 108 can include the formation of fin base portion 108A and fin top portion 108B on substrate 106 as shown in FIGS. 2A-2C.

Substrate 106 can be a semiconductor material, such as silicon. In some embodiments, substrate 106 includes a crystalline silicon substrate (e.g., wafer). In some embodiments, substrate 106 includes (i) an elementary semiconductor, such as germanium; (ii) a compound semiconductor including silicon carbide, gallium arsenide, gallium phosphide, indium phosphide, indium arsenide, and/or indium antimonide; (iii) an alloy semiconductor including silicon germanium carbide, silicon germanium, gallium arsenic phosphide, gallium indium phosphide, gallium indium arsenide, gallium indium arsenic phosphide, aluminum indium arsenide, and/or aluminum gallium arsenide; or (iv) a combination thereof. Further, substrate 106 can be doped depending on design requirements (e.g., p-type substrate or n-type substrate). In some embodiments, substrate 106 can be doped with p-type dopants (e.g., boron, indium, aluminum, or gallium) or n-type dopants (e.g., phosphorus or arsenic).

Fin structure 108 extends along an x-axis. Fin structure 108 can be a part of a substrate and include a fin base portion 108A and a fin top portion 108B disposed on fin base portion 108A. In some embodiments, fin base portion 108A can include material similar to substrate 106. Fin base portion 108A can be formed from a photolithographic patterning and an etching of substrate 106. In some embodiments, fin top portion 108B can include a stack of semiconductor layers. Each semiconductor layer can be subsequently processed to form a channel region underlying subsequently formed gate structures of the finFETs. Fin top portion 108B can include a first group of semiconductor layers 122 and a second group of semiconductor layers 124 stacked in an alternating configuration. Each of semiconductor layer 122 and 124 can be epitaxially grown on its underlying layer and can include semiconductor materials different from each other. In some embodiments, semiconductor layers 122 and 124 can include semiconductor materials similar to or different from substrate 106. In some embodiments, semiconductor layers 122 and 124 can include semiconductor materials with oxidation rates and/or etch selectivity different from each other. In some embodiments, each of semiconductor layers 122 can be formed of silicon and each of semiconductor layers 124 can be formed of silicon germanium (SiGe). In some embodiments, semiconductor layers 122 can be formed of silicon germanium and semiconductor layers 124 can be formed of silicon. Semiconductor layers 122 and/or semiconductor layers 124 can be undoped or can be in-situ doped during their epitaxial growth process using (i) p-type dopants, such as boron, indium, and gallium; and/or (ii) n-type dopants, such as phosphorus and arsenic. For p-type in-situ doping, p-type doping precursors, such as diborane ($B_2H_6$), boron trifluoride ($BF_3$), and any other p-type doping precursor, can be used. For n-type in-situ doping, n-type doping precursors, such as phosphine ($PH_3$), arsine ($AsH_3$), and any other n-type doping precursor, can be used. Though four layers for each of semiconductor layers 122 and semiconductor layers 124 are shown in FIGS. 2A-2C, semiconductor device 200 can have any suitable number of semiconductor layers 122 and semiconductor layers 124.

Forming fin base portion 108A and fin top portion 108B can include forming a stack of materials for semiconductor layers 122 and 124 on substrate 106 and etching a portion of substrate 106 and the stack of materials through patterned hard mask layers 134 and 136 formed on the stack of materials. In some embodiments, hard mask layer 134 can be a thin film including silicon oxide formed using, for example, a thermal oxidation process. In some embodiments, hard mask layer 136 can be formed of silicon nitride using, for example, LPCVD or PECVD. The etching of the stack of materials can include a dry etch, a wet etch process, or a combination thereof. Hard mask layers 134 and 136 can be removed after fin structures 108 are formed.

Figure 3A:
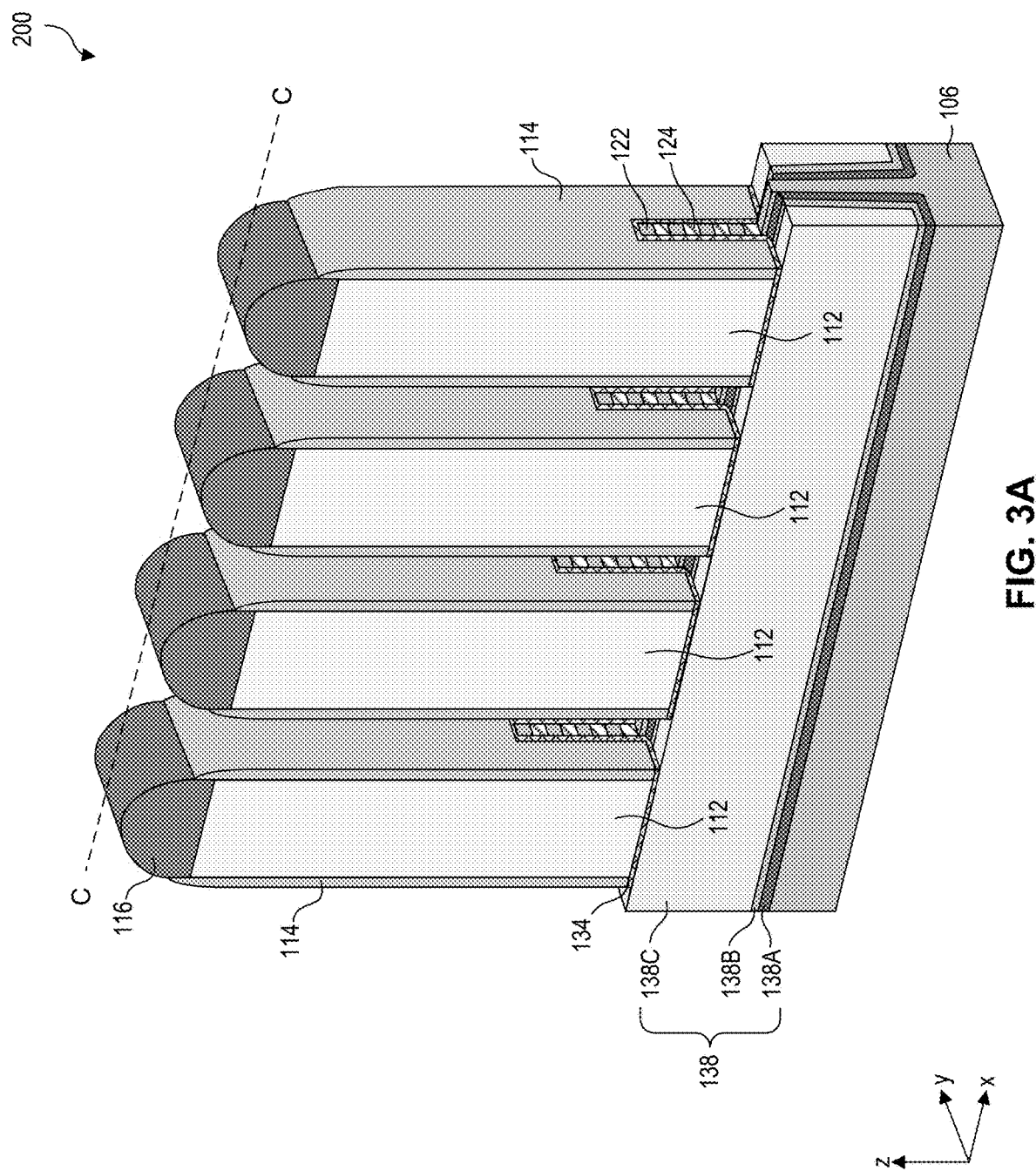
Figure 3B:
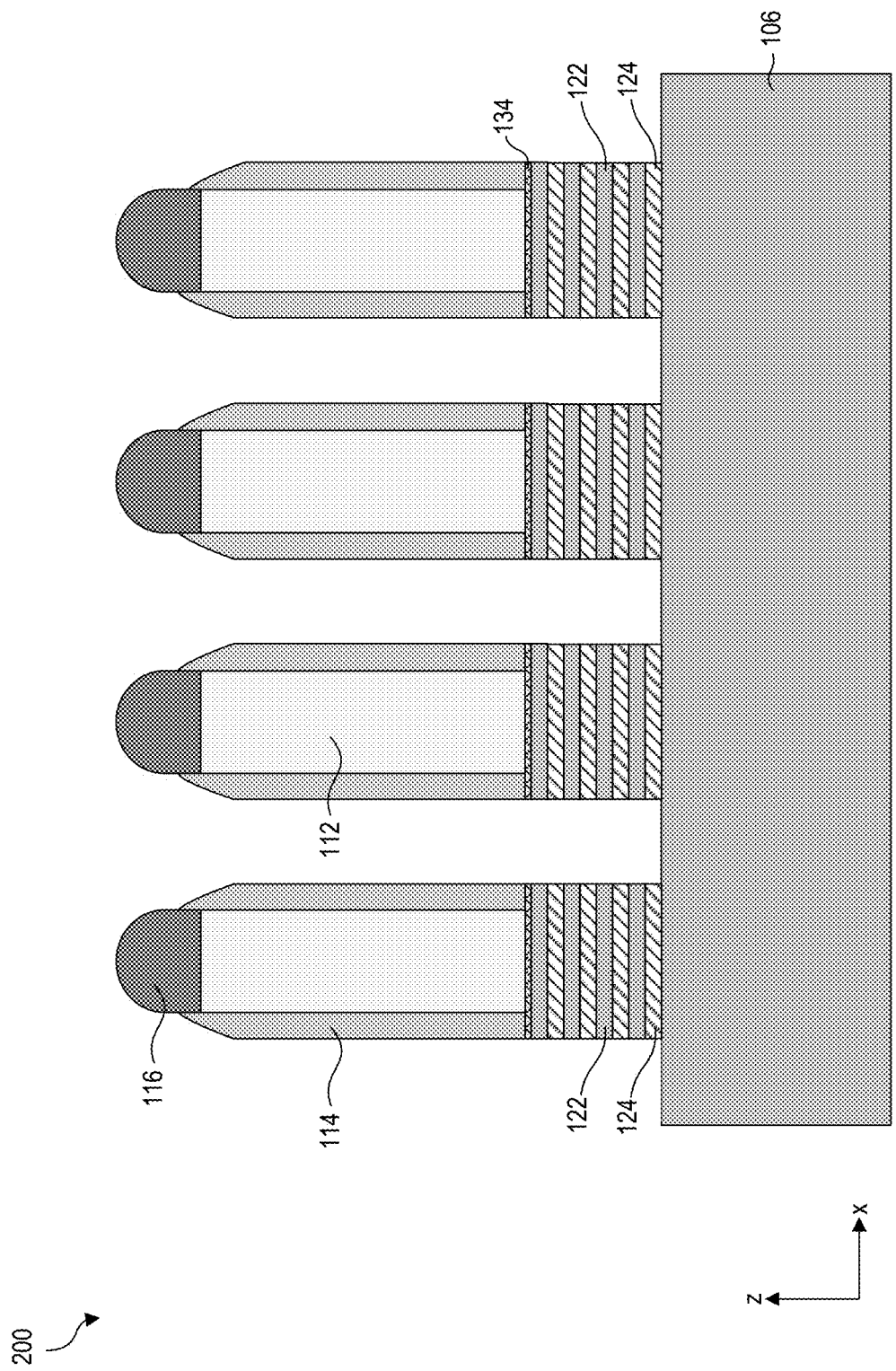

Referring to FIG. 1, in operation 110, sacrificial gate structures are formed on the substrate and the semiconductor layers are etched, according to some embodiments. Referring to FIGS. 3A and 3B, STI regions 138 with first and second protective liners 138A-138B and insulating layer 138C can be formed on substrate 106. FIG. 3B is a cross-sectional view of semiconductor device 200 in FIG. 3A as viewed from the lines of C-C. In some embodiments, hard mask layer 136 remains on the top surfaces of hard mask 134 after the formation of STI regions 138. In some embodiments, hard mask layer 136 is removed prior to the formation of STI regions 138. Forming STI regions 138 can include (i) depositing a layer of nitride material (not shown) for first protective liners 138A on the structure of FIG. 2A, (ii) depositing a layer of oxide material (not shown) for second protective liners 138B on the layer of nitride material, (iii) depositing a layer of insulating material for insulating layers 138C on the layer of oxide material, (iv) annealing the layer of insulating material for insulating layer 138C, (v) chemical mechanical polishing (CMP) the layers of nitride and oxide materials and the annealed layer of insulating material, and (vi) etching back the polished structure to form the structure of FIG. 3A. The layers of nitride and oxide materials can be deposited using a suitable process for depositing oxide and nitride materials, such as ALD and CVD. These layers of oxide and nitride materials can prevent oxidation of the sidewalls of fin top portion 108B during the deposition and annealing of the insulating material for insulating layer 138C. In some embodiments, the layer of insulating material for insulating layer 138C can include silicon oxide, silicon nitride, silicon oxynitride, fluoride-doped silicate glass (FSG), or a low-k dielectric material. In some embodiments, the layer of insulating material can be deposited using a CVD process, a high-density-plasma (HDP) CVD process, using silane ($SiH_4$) and oxygen ($O_2$) as reacting precursors. In some embodiments, the layer of insulating material can be formed using a sub-atmospheric CVD (SACVD) process or high aspect-ratio process (HARP), where process gases can include tetraethoxysilane (TEOS) and/or ozone ($O_3$).

Polysilicon gate structures 112 are formed on STI regions 138, as shown in FIGS. 3A and 3B. Polysilicon gate structures 112 are sacrificial gate structures and can be replaced in a gate replacement process to form metal gate structures. In some embodiments, the formation of polysilicon gate structures 112 can include blanket depositing a layer of polysilicon material and etching the layer of polysilicon material through a patterned hard mask layer 116 formed on the layer of polysilicon material. In some embodiments, the layer of polysilicon material can be undoped and hard mask layer 116 can include an oxide layer and/or a nitride layer. The oxide layer can be formed using a thermal oxidation process and the nitride layer can be formed by LPCVD or PECVD. Hard mask layer 116 can protect polysilicon gate structures 112 from subsequent processing steps (e.g., during formation of spacers 114, source/drain regions, and/or ILD layers). The blanket deposition of the layer of polysilicon material can include CVD, PVD, ALD, or any other suitable deposition process. In some embodiments, etching of the deposited layer of polysilicon material can include a dry etch, a wet etch, or a combination thereof. Spacers 114 can be formed on sidewalls of polysilicon gate structures 112. Forming spacers 114 can include blanket depositing a layer of an insulating material (e.g., an oxide, a nitride, and/or silicon carbon oxynitride material) followed by photolithography and an etching process (e.g., reactive ion etching or any other suitable dry etching process using a chlorine- or fluorine-based etchant).

Fin top portions can be etched after polysilicon gate structures 112 are formed. The etch process can remove portions of semiconductor layers 122 and semiconductor layers 124 that are exposed between adjacent polysilicon gate structures 112. The etch process can include a wet etch process using, for example, diluted HF. In some embodiments, one or more etching process can be used. For example, the etching process can include an etching process for removing silicon material and another etching process for removing silicon germanium material. During the etching process, polysilicon gate structures 112 can be protected from being etched by spacers 114 and hard mask layer 116.

Figure 4:
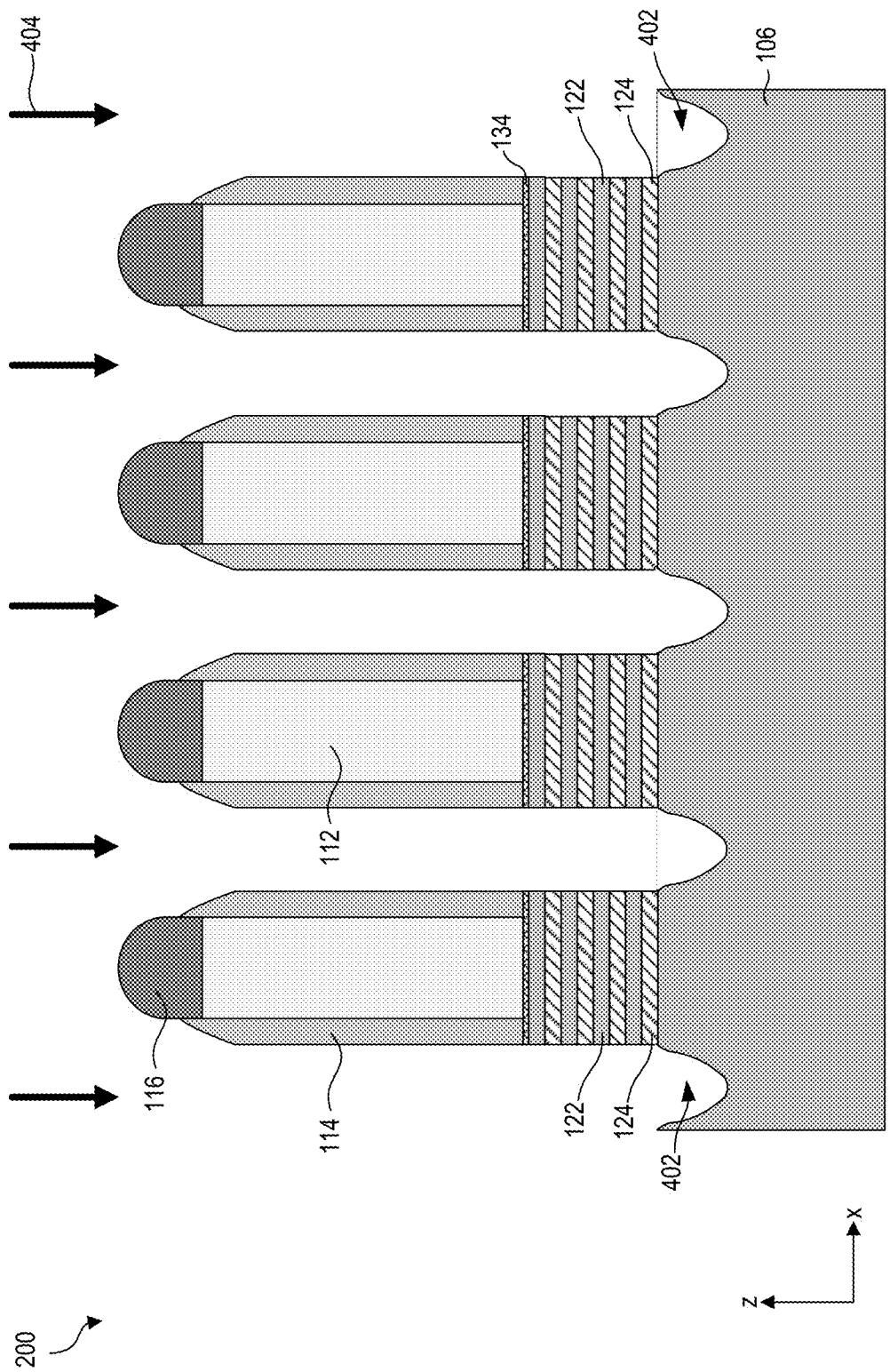

Referring to FIG. 1, in operation 115, recesses can be formed in the substrate between polysilicon gate structures, according to some embodiments. Referring to FIG. 4, recesses 402 (e.g., grooves) can be formed in substrate 106 and between adjacent poly gate structures 112. Recesses 402 can be formed using an anisotropic etching process 404 with an etching rate in the vertical direction (e.g., along the z-axis) substantially greater than an etching rate in the horizontal direction (e.g., along the x-axis). For example, a plasma etching process using fluorine and/or chlorine etchants can be used. In some embodiments, the plasma etching process can use sulfur hexafluoride, carbon tetrafluoride, fluoroform, boron trichloride, hydrogen bromide, any suitable etchants, and/or combinations thereof. In some embodiments, a voltage bias can be applied to substrate 106 to increase the etching rate in the vertical direction. In some embodiments, recesses 402 can be formed during operation 110 of etching semiconductor layers 122 and semiconductor layers 124. For example, etching semiconductor layers 122 and 124 can include alternating cycles of etching processes, and etching process 404 can use similar plasma species as the plasma etching process for etching semiconductor layers 122. In some embodiments, recesses 402 can have a concave shape with sloped sidewalls (e.g., a substantially U-shaped structure) which can reduce voids in subsequently formed source/drain regions by eliminating sharp corners. Although recesses 402 having U-shaped cross-sections are shown in FIG. 4, recesses 402 can have any other suitable shapes not illustrated in FIG. 4 for simplicity. For example, recesses 402 can have a substantially V-shaped cross-section area. In some embodiments, recesses 402 can have substantially vertical sidewalls.

Figure 5:
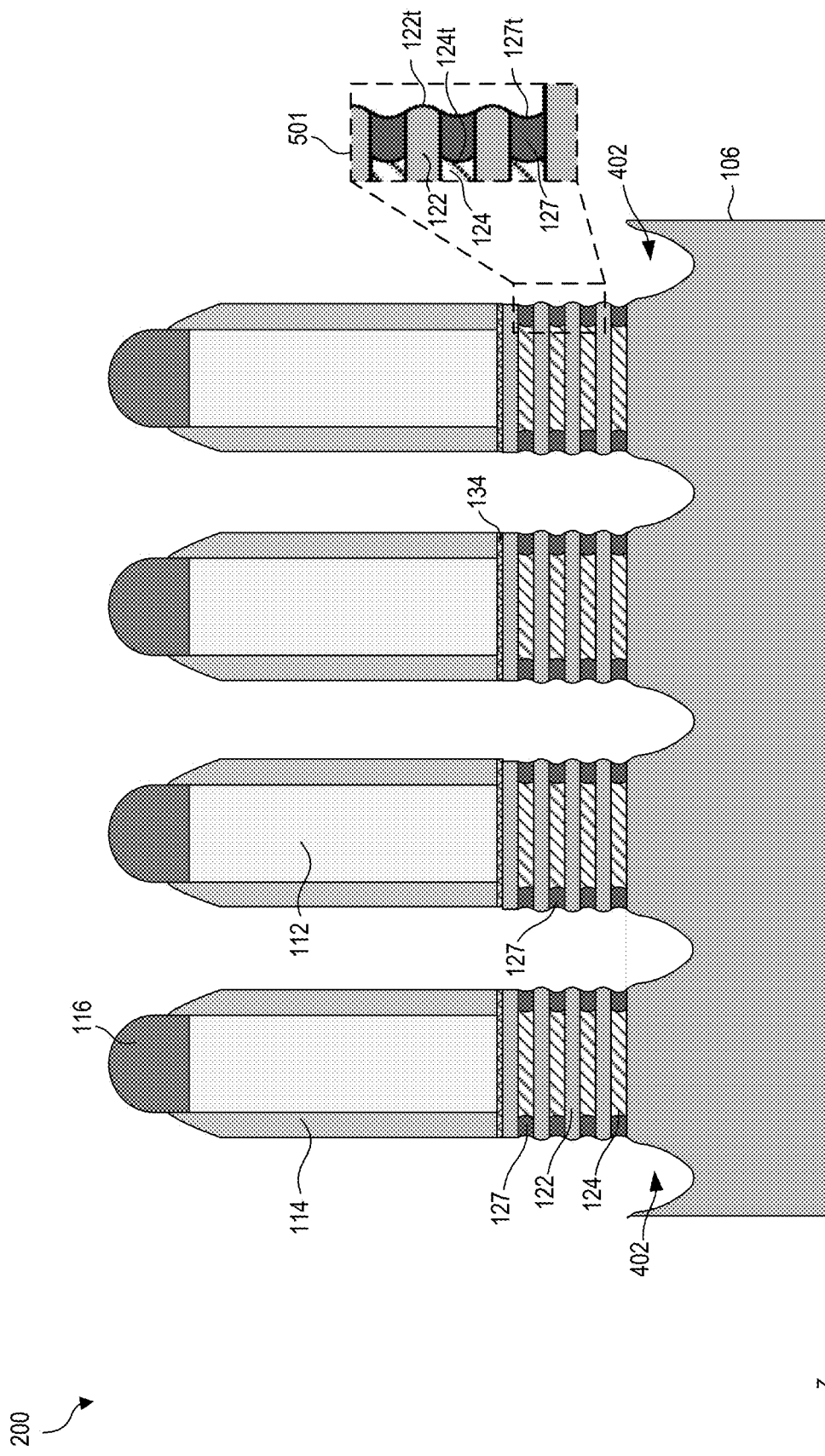

Referring to FIG. 1, in operation 120, inner spacer structures are formed between the semiconductor layers, according to some embodiments. Referring to FIG. 5, portions of semiconductor layers 124 can be etched back to form recessed regions and dielectric material can be deposited in the recessed regions to form inner spacers 127. For example, semiconductor device 200 shown in FIG. 5 can include n-type metal-oxide-semiconductor (NMOS) devices and portions of semiconductor layers 124 are etched back.

Semiconductor device 200 can also include p-type metal-oxide-semiconductor (PMOS) devices. PMOS device configurations are not shown in FIG. 5 for simplicity. For the PMOS device configurations, semiconductor layers 124 can be processed to be used as the channel regions. Semiconductor layers 122 can be etched back using suitable etching processes and inner spacers 127 can be formed between adjacent semiconductor layers 124 using similar deposition and etching processes described below.

Semiconductor layers 124 can be etched back by a dry etching process, a wet etching process, or a combination thereof. The etch back process of semiconductor layers 124 can be configured to form non-planar outer surfaces of semiconductor layers 122 and 124. For example, the etching process can include alternating cycles of etching and purging processes. The etching process in each cycle can include using a gas mixture having hydrogen fluoride (HF), nitrogen trifluoride ($NF_3$), a fluorine-based gas, and a chlorine-based gas. As shown in enlarged view 501 of FIG. 5, semiconductor layers 122 can have curved convex outer surfaces 122t and semiconductor layers 124 can have curved concave outer surfaces 124t. In some embodiments, subsequently formed inner spacers 127 can also have outer surfaces 127t that substantially contour outer surface 124t of semiconductor layers 124. The non-planar (e.g., curved) outer surfaces of inner spacers 127 and semiconductor layers 122 can reduce voids in subsequently formed source/drain structures by removing sharp corners where voids tend to form.

The process of forming recess regions can be followed by a blanket deposition of a dielectric material layer and a horizontal etch of the blanket-deposited dielectric material layer to form inner spacers 127 on the concave outer surface 124t of semiconductor layers 124 and on top/bottom surfaces of semiconductor layers 122. In some embodiments, the blanket deposition process can include a plurality of cycles of deposition and etch processes. In each cycle, the etch process can follow the deposition process to prevent the formation of voids within inner spacers 127. Inner spacer structures 127 can include a single layer or a stack of dielectric layers, deposited by ALD, FCVD, or any other suitable deposition process. The etch process in each cycle of the blanket deposition process of dielectric material layer can include a dry etch process using a gas mixture of HF and $NH_3$. Inner spacer structures 127 can include suitable dielectric material, such as silicon, oxygen, carbon, or nitrogen. The horizontal etch process of the blanket deposited dielectric material layer to form inner spacers 127 can be performed by a dry etch process using a gas mixture of HF and $NH_3$. Other methods of deposition and horizontal etch processes for forming inner spacer structures 127 can be used.

Figure 6:
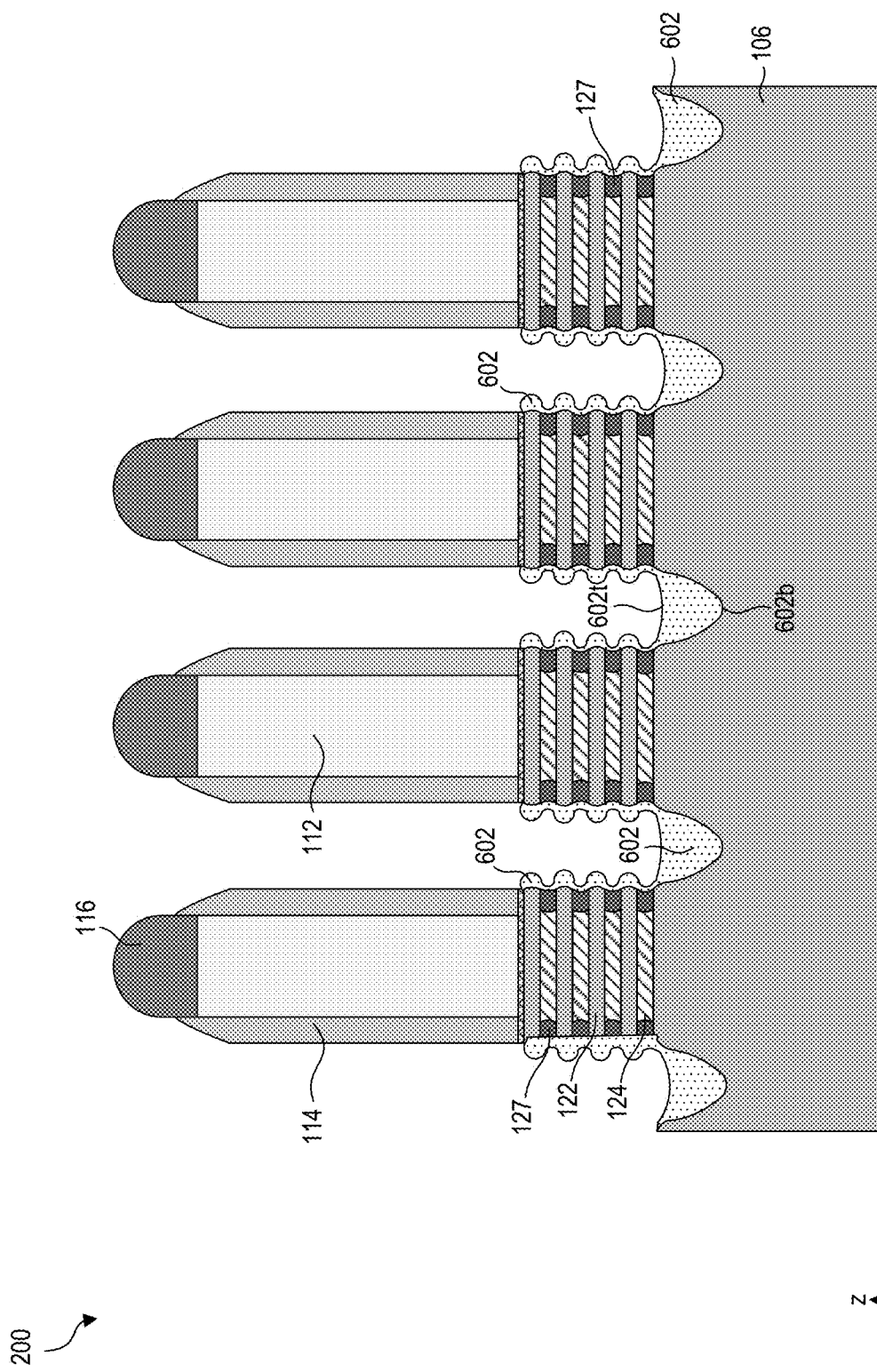

Referring to FIG. 1, in operation 125, a first epitaxial layer can be disposed on the exposed surfaces of the substrate, the inner spacers, and the semiconductor layers, according to some embodiments. Referring to FIG. 6, first epitaxial layer 602 can be deposited in recess 402 illustrated in FIG. 5 as well as outer surfaces of semiconductor layers 122 and inner spacers 127. In some embodiments, first epitaxial layer 602 can be formed by a selective growth process where a semiconductor material is grown on selective surfaces. For example, in NMOS devices, first epitaxial layer 602 can be formed by epitaxially growing a crystalline material using exposed portions of substrate 106 and semiconductor layers 122 as seed layers. In some embodiments, substrate 106 and semiconductor layers 122 are formed of crystalline silicon, and an epitaxial deposition method using self-assembly monolayer (SAM) or selective-area ALD can be used to selectively grow crystalline silicon on exposed surfaces of substrate 106 and semiconductor layers 122. Crystalline silicon material that are epitaxially deposited on adjacent semiconductor layers 122 and substrate 106 can expand and merge together, covering outer surfaces of inner spacer 127. For PMOS devices, first epitaxial layer 602 can be formed by epitaxially growing a crystalline material using exposed portions of substrate 106 and semiconductor layers 124 as seed layers. For example, first epitaxial layer 602 can be formed using crystalline silicon germanium.

After the deposition process, a continuous layer of first epitaxial layer 602 can be formed. In some embodiments, first epitaxial layer 602 can have non-uniform thicknesses. For example, first epitaxial layer 602 that is formed on outer surfaces of semiconductor layers 122 can have a greater thickness than first epitaxial layer 602 formed on outer surfaces of inner spacer 127. In some embodiments, first epitaxial layer 602 formed on outer surface of inner spacer 127 can have a thickness that is between about 20 nm and about 50 nm, between about 30 nm and about 40 nm, between about 33 nm and about 37 nm, or any suitable thicknesses. In some embodiments, first epitaxial layer 602 formed in recess 402 can have a thickness that is between about 20 nm and about 100 nm, between about 30 nm and about 80 nm, between about 40 nm and about 60 nm, or any suitable thicknesses.

First epitaxial layer 602 can be formed of silicon, silicon germanium, silicon phosphide, any suitable semiconductor material, and/or combinations of the same. In some embodiments, first epitaxial layer 602 can be doped with suitable dopants, such as boron and phosphorus.

For NMOS device configurations, semiconductor layers 122 and first epitaxial layer 602 can be formed using similar materials. For example, NMOS devices incorporating semiconductor layers 122 formed of silicon can implement first epitaxial layer 602 formed of silicon. First epitaxial layer 602 can be doped with suitable dopants. For example, first epitaxial layer 602 can be doped with n-type dopants, such as phosphorous. In some embodiments, first epitaxial layer 602 can be doped with phosphorous or arsenic to an atomic concentration between about $0.5 \times 10^{20}$ at/$cm^3$ and about $8 \times 10^{20}$ at/$cm^3$, between about $0.7 \times 10^{20}$ at/$cm^3$ and about $6 \times 10^{20}$ at/$cm^3$, between about $1 \times 10^{20}$ at/$cm^3$ and about $5 \times 10^{20}$ at/$cm^3$, or any suitable ranges.

For PMOS device configurations, semiconductor layers 124 and first epitaxial layer 602 can be formed using similar materials. For example, PMOS devices incorporating semiconductor layers 124 formed of silicon germanium can implement first epitaxial layer 602 formed of silicon germanium. In some embodiments, the germanium atomic content ratios of semiconductor layers 124 and first epitaxial layer 602 can be within about ±10% of each other. For example, semiconductor layers 124 can have a germanium atomic content ratio of about 25%, and first epitaxial layer 602 can have a germanium atomic content ratio between about 22% and about 28%, such as about 25%. In some embodiments, the germanium atomic content can be greater in first epitaxial layer 602 than in semiconductor layers 124. In some embodiments, first epitaxial layer 602 can be doped with suitable dopants. For example, first epitaxial layer 602 in PMOS device configurations can be doped with p-type dopants, such as boron. For example, first epitaxial layer 602 in PMOS devices can be doped with boron to an atomic concentration between about $0.5 \times 10^{20}$ at/$cm^3$ and about $8 \times 10^{20}$ at/$cm^3$, between about $0.7 \times 10^{20}$ at/$cm^3$ and about $6 \times 10^{20}$ at/$cm^3$, between about $1 \times 10^{20}$ at/$cm^3$ and about $5 \times 10^{20}$ at/$cm^3$, or any suitable ranges.

In some embodiments, the implantation process for first epitaxial layer 602 can be performed using an ion implantation apparatus. During the implantation process, spacers 114 and hard mask layers 116 can act as masking layers to protect underlying semiconductor layers 122 and 124 from damage or contamination. In some embodiments, the ion implanting energy is tuned such that the dopant can be substantially implanted in the first epitaxial layer 602. In some embodiments, the ions can be applied in a substantially vertical (e.g., z-direction). As a result, dopant concentration in first epitaxial layer 602 that is formed in recesses 402 can have a non-uniform dopant concentration with dopant concentration decreasing from top surface 602*t* to bottom surface 602*b*.

First epitaxial layer 602 can be deposited using suitable deposition methods, such as (i) chemical vapor deposition (CVD), including but not limited to, low pressure CVD (LPCVD), atomic layer CVD (ALCVD), ultrahigh vacuum CVD (UHVCVD), reduced pressure CVD (RPCVD), and any other suitable CVD; (ii) molecular beam epitaxy (MBE) processes; (iii) any suitable epitaxial process; or (iv) a combination thereof. In some embodiments, first epitaxial layer 602 can be grown by an epitaxial deposition/partial etch process, which repeats the epitaxial deposition/partial etch process at least once. Such repeated deposition/partial etch process is also called a cyclic deposition-etch (CDE) process. In some embodiments, a plasma deposition process using species, such as germane, dichlorosilane, and hydrochloride, can be used to deposit first epitaxial layer 602 formed of silicon germanium. In some embodiments, a plasma deposition process using phosphane can be used to deposit first epitaxial layer formed of silicon phosphide.

In some embodiments, deposition process of first epitaxial layer 602 can have a greater deposition rate in recesses 402 than on exposed surfaces of semiconductor layers 122 due to the differences in surface crystal orientations of the surfaces. For example, a plasma deposition process using aforementioned species (e.g., germane, dichlorosilane, and hydrochloride) can deposit crystalline material at a greater rate on surfaces having (100) crystal orientation (e.g., surfaces in recesses 402) than surfaces having (110) or (111) crystal orientations (e.g., outer surfaces 122*t* of semiconductor layers 122). The deposited first epitaxial layer 602 can have the same crystal orientation as the material it is deposited on. In some embodiments, a ratio of the deposition rate in recess 402 over the deposition rate on outer surfaces of semiconductor layers 122 can be between about 2:1 and about 7:1, between about 3:1 and about 5:1, or any suitable ratios. Using values of deposition rate ratios greater or less than the aforementioned ranges can cause voids in the deposited epitaxial material and/or cause insufficient film coverage on semiconductor layers 122 and inner spacers 127.

Figure 7:
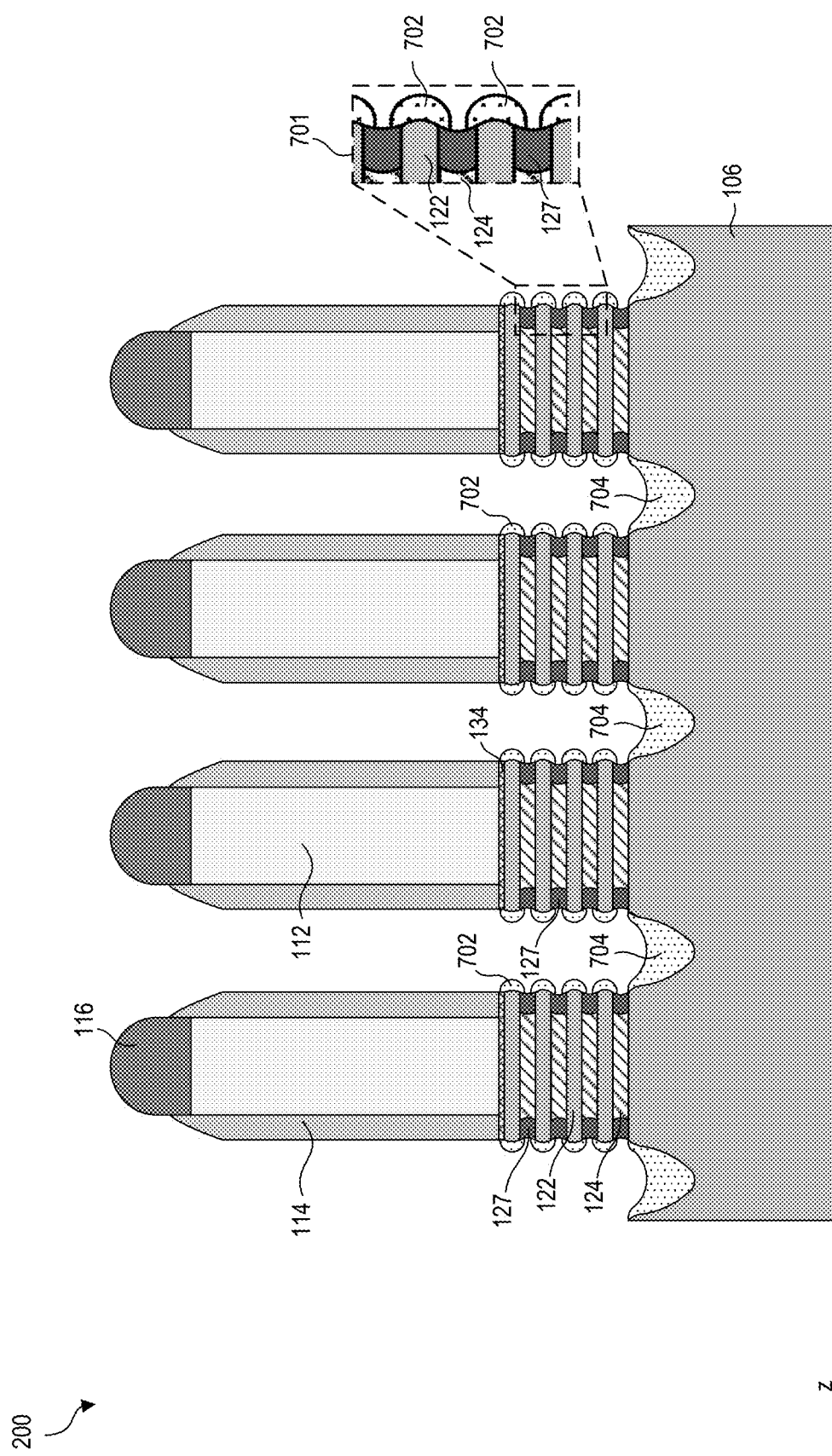

Referring to FIG. 1, in operation 130, the first epitaxial layer is etched back to expose portions of outer surfaces of inner spacer structures, according to some embodiments. Referring to FIG. 7, first epitaxial layer 602 can be etched back to expose portions of underlying inner spacers 127. The etch back process can also remove portions of first epitaxial layer 602 deposited in recesses 402. The remaining portions of first epitaxial layer 602 can form epitaxial end caps 702 on end portions of semiconductor layers 122 and epitaxial base 704 in recesses 402. Due to the non-planar outer surface of semiconductor layers 122, epitaxial end caps 702 can have non-planar inner and outer surfaces. In some embodiments, epitaxial end caps 702 can have a substantially crescent shape, as shown in enlarged view 701 of FIG. 7. Specifically, both inner surface and outer surface of epitaxial end caps 702 can have curved surfaces with end portions that are respectively connected with each other. In some embodiments, epitaxial end caps 702 can be formed using other suitable shapes. Epitaxial end caps 702 can be in direct contact with outer surfaces of inner spacers 127. Incorporating epitaxial end caps 702 on semiconductor layers 122 can reduce defects (e.g., voids) that may be formed on end portions of semiconductor layers 122 and also reduce short channel effects. Epitaxial base 704 can be formed in recesses 402 and on substrate 106. In some embodiments, epitaxial base 704 can be in direct contact with one or more inner spacers 127.

The etching back process of first epitaxial layer 602 to form epitaxial end caps 702 and epitaxial base 704 can include an anisotropic etching process. For example, the etching rate of first epitaxial layer 602 formed on semiconductor layers 122 and inner spacers 127 can be greater than etching rate of first epitaxial layer 602 formed in recess 402. In some embodiments, the differences in etching rates can be attributed to crystal orientation differences. For example, etching rate can be greater on surfaces having (110) or (111) crystal orientations (e.g., sidewall surfaces of first epitaxial layer 602 formed over semiconductor layers 122) than surfaces having (100) crystal orientation (e.g., first epitaxial layer 602 formed on surfaces in recesses 402). The anisotropic etching process can etch back sidewalls of first epitaxial layer 602 to form epitaxial end caps 702 while epitaxial base 704 formed in recesses 402 remains in contact with inner spacer 127.

Figure 8:
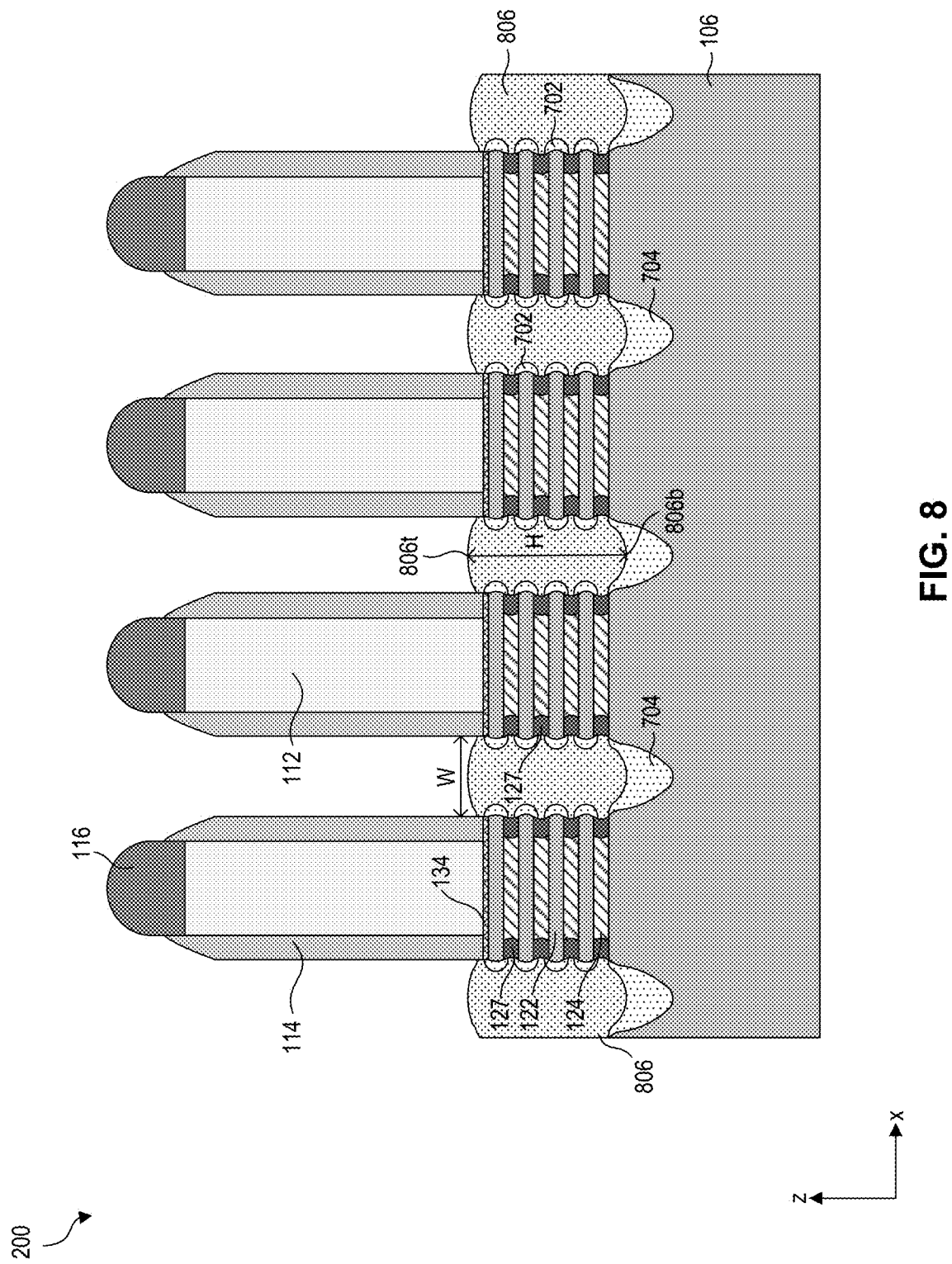

Referring to FIG. 1, in operation 135, a second epitaxial layer is disposed on the epitaxial end caps, epitaxial bases, and inner spacers, according to some embodiments. Referring to FIG. 8, a second epitaxial layer 806 can be an epitaxial body deposited between adjacent polysilicon gate structures 112 and on exposed surfaces of epitaxial end caps 702, inner spacers 127, and epitaxial bases 704. Second epitaxial layer 806 can form the bulk of source/drain regions of semiconductor device 200. In some embodiments, second epitaxial layer 806 is the same material as the material of substrate 106. In some embodiments, second epitaxial layer 806 includes a different material from the material of substrate 106. Second epitaxial layer 806 can include: (i) a semiconductor material, such as germanium and silicon; (ii) a compound semiconductor material, such as gallium arsenide and aluminum gallium arsenide; or (iii) a semiconductor alloy, such as silicon germanium and gallium arsenide phosphide. In some embodiments, second epitaxial layer 806 can be grown by depositions processes similar to that of first epitaxial layer 602. In some embodiments, the deposition processes can be different. For example, second epitaxial layer 806 can be formed using a plasma deposition process with an in-situ implantation process, and the dopant concentration in second epitaxial layer 806 can be greater than the dopant concentration of first epitaxial layer 602. In some embodiments, an implantation process can be performed during or after the deposition process of second epitaxial layer 806. During the implantation process, spacers 114 and hard mask layers 116 can act as masking layers to protect underlying semiconductor layers 122 and semiconductor layers 124 from damage or contamination. In some embodiments, the ion implanting energy is tuned such that the dopant can be substantially implanted in first epitaxial layer 602. In some embodiments, the ions can be applied in a substantially vertical (e.g., z-direction). As a result, dopant concentration in second epitaxial layer 806 can have a non-uniform dopant concentration with dopant concentration decreasing from top surface 806*t* to bottom surface 806*b*.

In some embodiments, second epitaxial layer 806 can also be deposited on spacers 114. In some embodiments, second epitaxial layer 806 can be formed of silicon germanium, silicon phosphide, silicon arsenide, any suitable semiconductor material, and/or combinations thereof. In some embodiments, second epitaxial layer 806 can be formed using similar material as first epitaxial material 602. For example, PMOS devices can include second epitaxial layer 806 formed of silicon germanium. In some embodiments, NMOS devices can include second epitaxial layer 806 formed of silicon phosphide. In some embodiments, second epitaxial layer 806 can be formed using a material different from first epitaxial material 602. In some embodiments, dopant concentrations of second epitaxial layer 806 can be non-uniform. For example, second epitaxial layer 806 formed of silicon germanium can have a germanium concentration that gradually decreases from a top surface of second epitaxial layer 806 towards epitaxial base 704. In some embodiments, dopant concentration in second epitaxial layer 806 can vary along the horizontal direction (e.g., along the x-axis). In some embodiments, any suitable dopants can be implanted into second epitaxial layer 806. For example, boron can be implanted into the silicon germanium material with a dopant concentration between about $5 \times 10^{19}$ at/cm$^3$ and about $2 \times 10^{21}$ at/cm$^3$. In some embodiments, phosphorous or arsenic can be implanted into the silicon material to form silicon phosphide or silicon arsenide, in which the dopant concentration of phosphide or arsenic can be between about $5 \times 10^{19}$ at/cm$^3$ and about $2 \times 10^{21}$ at/cm$^3$.

Second epitaxial layer 806 can be deposited using suitable deposition methods. For example, second epitaxial layer 806 can be deposited using methods similar to those of forming first epitaxial layer 602. For example, a plasma deposition process using species, such as germane, dichlorosilane, and hydrochloride, can be used to deposit second epitaxial layer 806 formed of silicon germanium. In some embodiments, a plasma deposition process using phosphane or arsenic can be used to deposit second epitaxial layer 806 formed of silicon phosphide or silicon arsenide, respectively. The deposition process of second epitaxial layer 806 can continue until the opening between opposing inner spacers 127 and epitaxial end caps 702 is filled. In some embodiments, a top surface of second epitaxial layer 806 is in contact with spacers 114 and above a top surface of the upper most semiconductor layers 122. An optional etching process can be used to etch back second epitaxial layer 806 to prevent dopant from second epitaxial layer 806 diffusing into subsequently formed metal gate structures in place of polysilicon gate structures 112. In some embodiments, the etching process can use a chloride-based etchant, such as hydrochloride. In some embodiments, the etching process can etch back second epitaxial layer 806 such that it is not in contact with spacers 114. In some embodiments, the etching process is performed to reduce the contact surface area between second epitaxial layer 806 and spacers 114. For example, top surface 806t can be a non-planar surface having end portions that are in contact with spacers 114 lower than the highest point of top surface 806t. In some embodiments, a width W of second epitaxial layer between opposing semiconductor layers 122 can be between about 10 nm and about 80 nm, between about 15 nm and about 75 nm, between about 20 nm and about 60 nm, or any suitable dimensions. In some embodiments, a height H of second epitaxial layer 806 measured from top surface 806t of second epitaxial layer 806 and bottom surface 806b can be between about 20 nm and about 140 nm, between about 30 nm and about 120 nm, between about 40 nm and about 100 nm, or any suitable dimensions.

Figure 9:
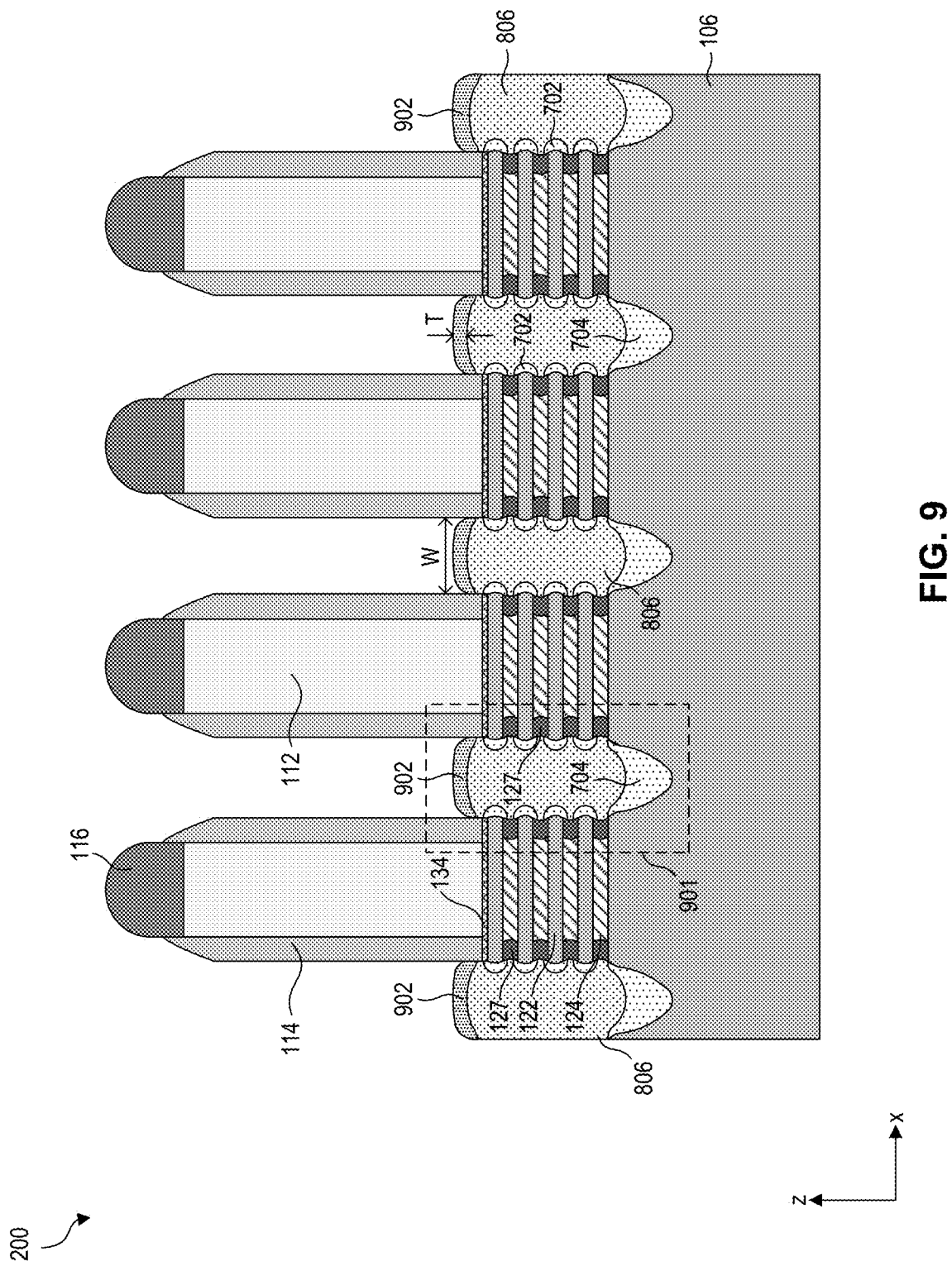

Referring to FIG. 1, in operation 140, a third epitaxial layer is formed on the second epitaxial layer, according to some embodiments. Referring to FIG. 9, third epitaxial layer 902 can be top caps that are formed on second epitaxial layer 806 and between adjacent polysilicon gate structures 112. In some embodiments, third epitaxial layer 902 can be formed using silicon, silicon germanium, silicon phosphide, any suitable semiconductor material, and/or combinations thereof. In some embodiments, third epitaxial layer 902 can be doped with suitable dopants, such as boron. In some embodiments, the dopant concentrations of third epitaxial layer 902 can be different from those of second epitaxial layer 806. A dopant concentration of boron or phosphide in third epitaxial layer 902 can be greater than those of second epitaxial layer 806. In some embodiments, dopant concentrations of boron or phosphorous of third epitaxial layer 902 can be between about $0.5 \times 10^{21}$ at/cm$^3$ and about $5 \times 10^{21}$ at/cm$^3$, between about $0.8 \times 10^{21}$ at/cm$^3$ and about $4 \times 10^{21}$ at/cm$^3$, between about $1 \times 10^{21}$ at/cm$^3$ and about $3 \times 10^{21}$ at/cm$^3$, or any suitable ranges. Third epitaxial layer 902 having higher dopant concentrations than second epitaxial layer 806 can provide the benefit of reducing contact resistance with subsequently formed source/drain contact structures. In some embodiments, third epitaxial layer 902 can be formed using plasma deposition methods that are similar to those that form first epitaxial layer 602 and second epitaxial layer 806. For example, third epitaxial layer 902 can be formed using a plasma deposition process and/or a selective epitaxial deposition process. A thickness T of third epitaxial layer can be between about 3 nm and about 40 nm, between about 5 nm and about 35 nm, between about 10 nm and about 30 nm, or any suitable thickness. In some embodiments, the width of third epitaxial layer 902 can be similar to the width of second epitaxial layer 806. For example, the width of third epitaxial layer 902 can be similar to width W and between about 20 nm and about 60 nm. Source/drain regions of semiconductor device 200 can include epitaxial end caps 702, epitaxial base 704, second epitaxial layer 806, and third epitaxial layer 902, according to some embodiments.

Figure 10:
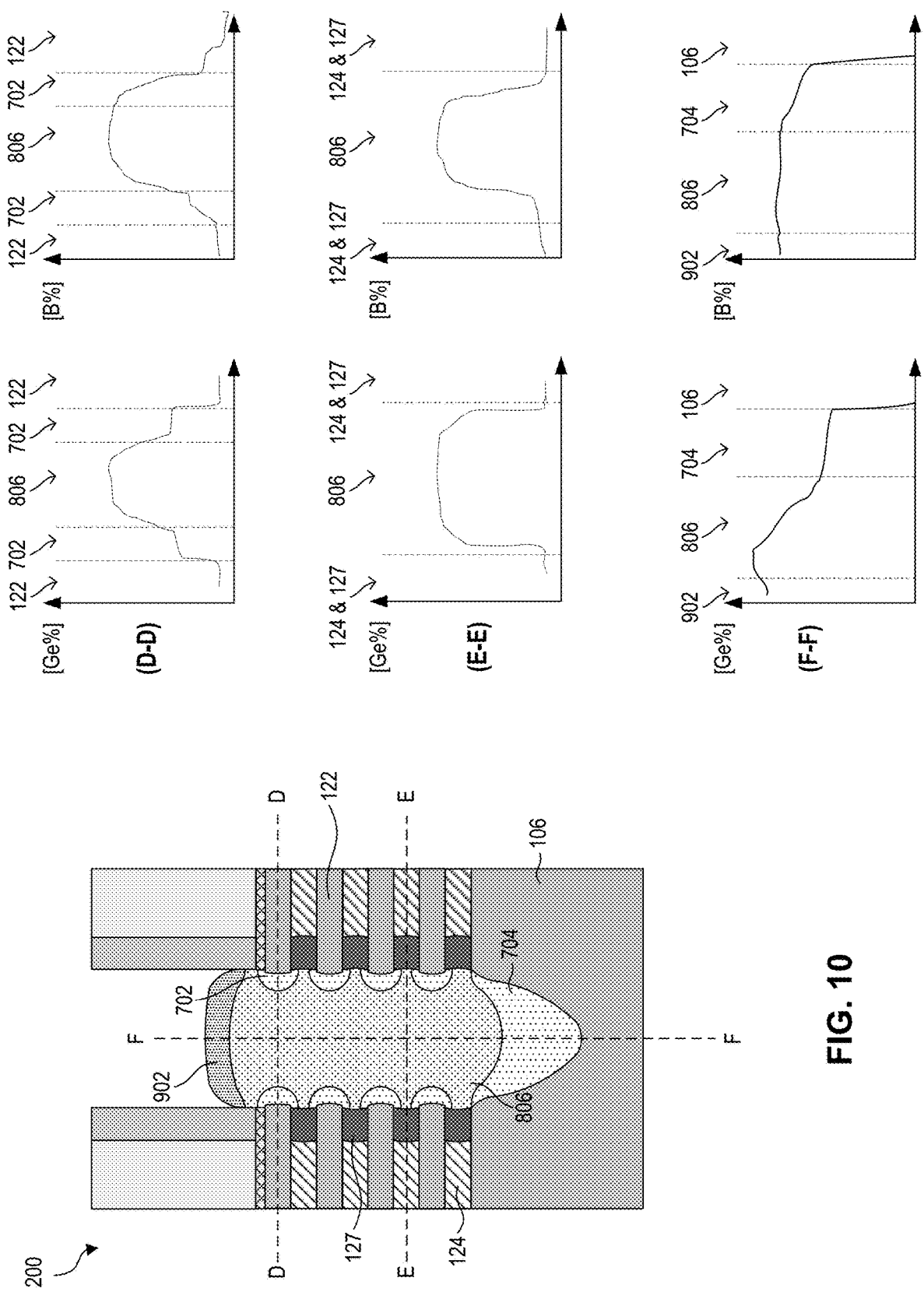
FIG. 10 illustrate an enlarged view of a portion of a semiconductor device and schematic diagrams of dopant concentration distributions, in accordance with some embodiments.

FIG. 10 includes an illustration of an enlarged view of region 901 illustrated in FIG. 9 and schematic diagrams of dopant distribution in various regions of the deposited epitaxial layers, according to some embodiments. The schematic diagrams in FIG. 10 illustrate germanium concentration and boron dopant concentration variations in first, second, and third epitaxial layers along the D-D, E-E, and F-F lines of semiconductor 200 illustrated in the enlarged view 901. As shown in FIG. 10, horizontal D-D line intersects with semiconductor layers 122, epitaxial end caps 702, and second epitaxial layer 806. As shown in the germanium concentration and boron dopant concentration diagrams along horizontal line D-D, the concentrations can be highest in second epitaxial layer 806 and gradually decrease in epitaxial end caps 702, and further gradually decrease in semiconductor layers 122, according to some embodiments. Epitaxial end caps 702 can reduce short channel effects by acting as a diffusion shield. For example, by having a dopant concentration that is lower than second epitaxial layer 806, epitaxial end caps 702 can prevent dopant diffusion between semiconductor layers 122 and second epitaxial layer 806. Horizontal E-E line intersects with semiconductor layers 124, inner spacers 127, and second epitaxial layer 806. As shown in the germanium and boron dopant concentration diagrams along horizontal line E-E, the dopant concentrations in second epitaxial layer 806 can be greater than the dopant concentrations in semiconductor layers 124 and in inner spacers 127, according to some embodiments. Vertical line F-F intersects with third epitaxial layer 902, second epitaxial layer 802, and epitaxial base 704. As shown in the germanium dopant concentration diagram along horizontal line F-F, the dopant concentrations can be highest in third epitaxial layer 902 and gradually decrease in second epitaxial layer 806 and further gradually decrease in epitaxial base 704, according to some embodiments. For example, germanium atomic ratio of second epitaxial layer 806 can decrease from about 50% and about 60% at its top surface 806t to about 20% and about 30% at its bottom surface 806b. As shown in the boron dopant concentration diagram along horizontal line F-F, the dopant concentrations of third epitaxial layer 902 and second epitaxial layer 806 can be substantially the same. In some embodiments, the dopant concentration of third epitaxial layer 902 can be greater than the dopant concentration of second epitaxial layer 806. In some embodiments, germanium atomic ratio of third epitaxial layer 902 can be between about 30% and about 70%, between about 35% and about 65%, between about 40% and about 60%, or any suitable ratio. The boron dopant concentration of epitaxial base 702 can be lower than the dopant concentrations of second and third epitaxial layers 806 and 902, according to some embodiments.

Figure 11:
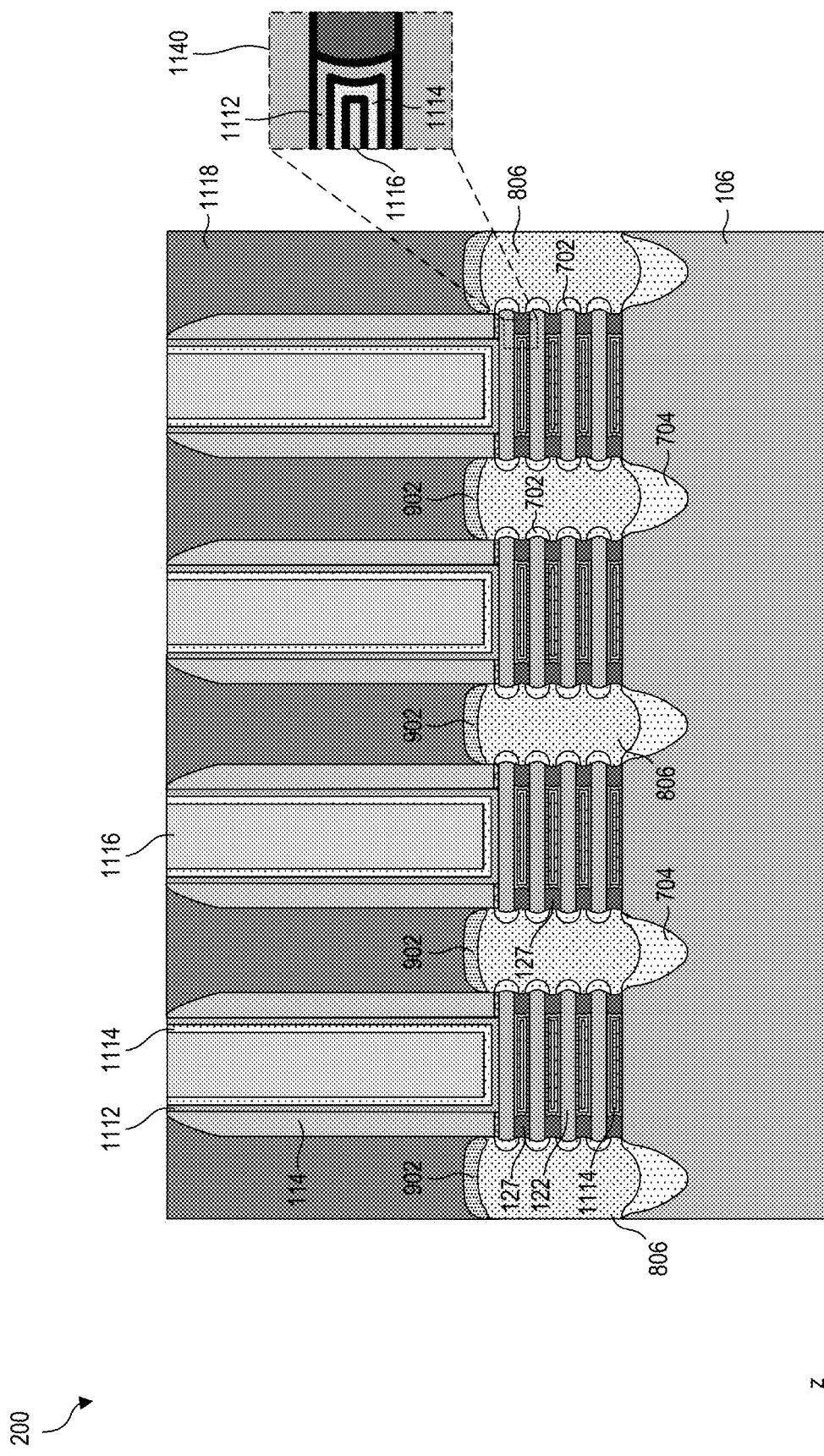
FIGS. 11 and 12 illustrate various cross-sectional views of semiconductor devices having multi-layer epitaxial source/drain structures at various stages of their fabrication process, in accordance with some embodiments.

Referring to FIG. 1, in operation 145, an interlayer dielectric (ILD) layer is deposited and a replacement gate process is performed, according to some embodiments. Referring to FIG. 11, ILD layer 1118 is deposited between spacers 114 and polysilicon gate structures are replaced by metal gate structures.

ILD layer 1118 can be disposed on third epitaxial layer 902 of the source/drain regions and between spacers 114. ILD layer 1118 can include a dielectric material deposited using a deposition method suitable for flowable dielectric materials (e.g., flowable silicon oxide, flowable silicon nitride, flowable silicon oxynitride, flowable silicon carbide, or flowable silicon oxycarbide). For example, the flowable silicon oxide can be deposited using flowable CVD (FCVD). In some embodiments, the dielectric material is silicon oxide. Other materials and formation methods for ILD layer 1118 are within the scope and spirit of this disclosure.

The formation of ILD layer 1118 can be followed by removing polysilicon gate structures 112 and semiconductor layers 124 using a dry etching process (e.g., reaction ion etching) or a wet etching process, exposing portions of semiconductor layers 122. The exposed semiconductor layers 122 can be referred to as nanostructures (e.g., nanowires or nanosheets). For PMOS device configurations, semiconductor layers 122 can be removed, exposing portions of semiconductor layers 124, which can also be referred to as nanostructures. In some embodiments, the gas etchants used in the dry etching process can include chlorine, fluorine, bromine, or a combination thereof. In some embodiments, an ammonium hydroxide ($NH_4OH$), sodium hydroxide (NaOH), and/or potassium hydroxide (KOH) wet etch can be used to remove polysilicon gate structures 112 and semiconductor layer 124, or a dry etch followed by a wet etch process can be used. Gate dielectric layers 1112 can be formed on the semiconductor layers. As shown in FIG. 11, gate dielectric layers 1112 can be wrapped around on exposed nanowire-shaped second semiconductor layers 122. Forming gate dielectric layers 1112 can include a blanket deposition process of a suitable gate dielectric material layer. In some embodiments, gate dielectric layers 1112 can be formed of a high-k dielectric material (e.g., dielectric material having dielectric constant greater than about 3.9). For example, gate dielectric layers 1112 can be formed of hafnium oxide. Work function layers 1114 are formed on gate dielectric layers 1112. In some embodiments, each work function layer 1114 can include one or more work function metal layers and formed using the same or different material and/or thickness. Gate dielectric layers 1112 and gate work function layers 1114 can each wrap around nanowire-shaped semiconductor layers 122. Depending on the spaces between adjacent semiconductor layers 122, semiconductor layers 122 can be wrapped around by gate dielectric layer 1112 and work function layers 1114, filling the spaces between adjacent semiconductor layers 122. In some embodiments, subsequently formed gate electrode material can also be formed in the spaces between adjacent semiconductor layers 122, as described below.

Gate electrodes 1116 can be formed on the work function layers, according to some embodiments. Layers of conductive material for gate electrodes 1116 are formed on work function layers 1114. As shown in enlarged view 1140, if separations between adjacent semiconductor layers 122 are sufficient to accommodate the thickness of the gate electrode material, gate electrodes 1116 can be formed between adjacent semiconductor layers 122 and on work function layers 1114 such that the spaces between adjacent semiconductor layers 122 are filled. Gate electrodes 1116 that are between adjacent semiconductor layers 122 and gate electrodes 1116 that are formed between spacers 114 are electrically coupled to each other. The layer of conductive material for gate electrodes 1116 can include suitable conductive materials, such as titanium, silver, aluminum, tungsten, copper, ruthenium, molybdenum, tungsten nitride, cobalt, nickel, titanium carbide, titanium aluminum carbide, manganese, zirconium, metal alloys, and combinations thereof. Gate electrodes 1116 can be formed by ALD, PVD, CVD, or any other suitable deposition process. The deposition of gate electrodes 1116 can continue until openings between opposing spacers 114 are filled with gate electrodes 1116. A chemical mechanical polishing process can remove excessive gate electrodes 1116 such that top surfaces of gate electrodes 1116 and ILD layer 1118 are substantially coplanar. In some embodiments, other structures can be formed, such as blocking layers. One or more blocking layers (not shown in FIG. 11) can be formed prior to depositing gate electrodes 1116 to prevent diffusion and oxidation of gate electrodes 1116.

Figure 12:
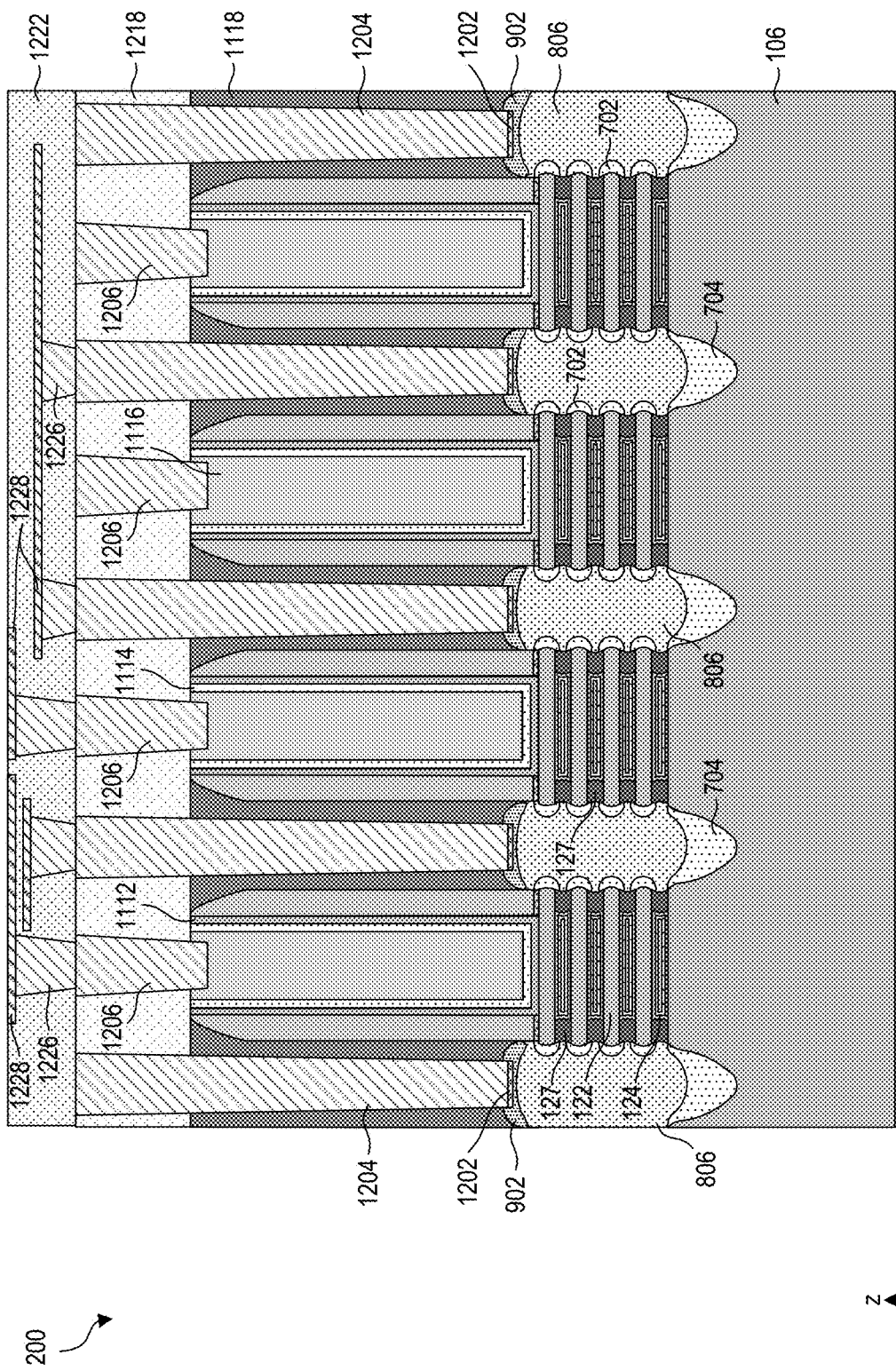

Referring to FIG. 1, in operation 150, source/drain contacts and gate contacts are formed, according to some embodiments. Referring to FIG. 12, source/drain contacts 1204 and gate contacts 1206 are formed to provide electrical connections to the source/drain regions and the gate electrodes, respectively. Specifically, source/drain contacts 1204 and gate contacts 1206 can be used to transmit electrical signals between source/drain regions and gate electrodes and external terminals (not shown in FIG. 12). For example, gate contacts 1206 can be electrically coupled to gate electrodes 1116 formed between spacers 114 and between adjacent semiconductor layers 122. Additional ILD layers can be formed on the top surface ILD layer 1118. For example, dielectric layer 1218 can be formed on ILD layer 1118. In some embodiments, dielectric layer 1218 can be formed using similar material as ILD layer 1118. Gate contacts 1206 and source/drain contacts 1204 can be formed by forming openings in dielectric layer 1218, gate electrodes 1116, and ILD layer 1118, and depositing a conductive material in the openings. The deposition process can include depositing a metal layer within the openings and performing an anneal process to induce silicidation of the deposited metal layer. The conductive materials for forming source/drain contacts 1204 and gate contacts 1206 can include titanium, aluminum, silver, tungsten, cobalt, copper, ruthenium, zirconium, nickel, titanium nitride, tungsten nitride, metal alloys, and/or combinations thereof. The deposition process can include ALD, PVD, CVD, any suitable deposition processes, and/or combinations thereof. Gate contacts 1206 and source/drain contacts 1204 can be connected to gate electrodes 1116 and third epitaxial layer 902 of the source/drain region, respectively.

A planarization process can planarize the top surfaces of dielectric layer 1218, source/drain contacts 1204, and gate contacts 1206 such that the top surfaces are substantially coplanar. In some embodiments, gate contacts 1206 can extend into gate electrodes 1116. In some embodiments, source/drain contacts 1204 can extend into third epitaxial region 902 of the source/drain regions. In some embodiments, source/drain contacts 1204 can extend into second epitaxial layer 806. Silicide regions can be formed between source/drain contacts 1204 and third epitaxial region 902 of the source/drain regions to reduce contact resistance. For example, silicide region 1202 can be formed between source/drain contacts 1204 and third epitaxial region 902. In some embodiments, silicide region 1202 can be formed of a titanium silicide material. Silicide regions 1202 can be formed by depositing a layer of conductive material on third epitaxial layer 902 and performing an annealing process. In some embodiments, the layer of conductive material can be the conductive material that forms source/drain contacts 1204. In some embodiments, the layer of conductive material can be a thin film of metal that chemically reacts with third epitaxial layer 902 to form silicide regions 1202. In some embodiments, silicide regions 1202 can include ruthenium silicide, nickel silicide, cobalt silicide, tungsten silicide, tantalum silicide, platinum silicide, erbium silicide, palladium silicide, any suitable silicide material, and/or combinations thereof.

Back-end-of-line (BEOL) interconnect structures are formed over source/drain contacts 1204 and gate contacts 1206. BEOL interconnect structures can be formed in dielectric layers 1222 deposited on dielectric layer 1218. Interconnects can be formed in dielectric layer 1222. In some embodiments, the interconnects can be a network of electrical connections that include vias 1226 extending vertically (e.g., along the z-axis) and wires 1228 extending laterally (e.g., along the x-axis). Interconnect structures can provide electrical connections to source/drain contacts 1204 and gate contacts 1206. In some embodiments, suitable passive and active semiconductor devices can be formed in dielectric layers 1218 and 1222 and are not illustrated for simplicity.

Various embodiments in the present disclosure describe methods for forming void-free epitaxial source/drain structures and preventing short channel effects in semiconductor devices. For example, a multi-step epitaxial source/drain formation process can be used in forming source/drain structures. In some embodiments, the semiconductor device can implement nanowires or nanosheet structures with spacers formed between adjacent nanowires or nanosheets. The multi-step epitaxial source/drain formation process can include forming epitaxial end caps around end portions of the nanowires or nanosheets in order to reduce defects and prevent short channel effects. Additional epitaxial materials are disposed on the epitaxial end caps and spacers until the bulk of source/drain structures are formed. An epitaxial cap layer can be formed on the top surface of the additional epitaxial materials for reducing contact resistance between the source/drain structure and subsequently formed source/drain contacts. Multi-step epitaxial source/drain structures described herein provide various benefits that can improve device performance, reliability, and yield.

In some embodiments, a semiconductor device includes nanostructures on a substrate and a source/drain region in contact with the nanostructures. The source/drain region includes epitaxial end caps, where each epitaxial end cap is formed at an end portion of a nanostructure of the nanostructures. The source/drain region also includes an epitaxial body in contact with the epitaxial end caps and an epitaxial top cap formed on the epitaxial body. The semiconductor device further includes gate structure formed on the nanostructures.

In some embodiments, a semiconductor device includes nanostructures and a nanostructure of the nanostructures has a non-planar outer surface. The semiconductor device also includes a gate dielectric layer wrapping around each nanostructure of the nanostructures and a gate electrode disposed on the gate dielectric layer and over the nanostructures. The semiconductor device also includes a source/drain region in contact with the nanostructures. The source/drain region includes epitaxial end caps, where an epitaxial end cap is formed at an end portion of the nanostructures and has a first dopant concentration. The source/drain region further includes an epitaxial body in contact with the epitaxial end cap and has a second dopant concentration greater than the first dopant concentration.

In some embodiments, a method includes forming nanostructures on a substrate and forming spacers, where each spacer is between a pair of nanostructures of the nanostructures. The method also includes etching the substrate to form a recess. The method further includes depositing a first epitaxial layer on sidewalls of the nanostructures, sidewalls of the spacers, and in the recess. The method also includes etching the first epitaxial layer to form epitaxial end caps and an epitaxial base in the recess, where each epitaxial end cap is formed on a sidewall of a nanostructure and the epitaxial base is in contact with a spacer. The method also includes depositing a second epitaxial layer on the end caps and the epitaxial base. The method further includes etching the second epitaxial layer and depositing a third epitaxial layer on the etched second epitaxial layer.

The foregoing disclosure outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a stack of first and second semiconductor layers arranged in an alternating configuration on a substrate;
   etching the substrate to form an opening adjacent to the stack of first and second semiconductor layers;
   forming inner spacers on sidewalls of the first semiconductor layers;
   forming a first epitaxial layer with first epitaxial portions on sidewalls of the second semiconductor layers, second epitaxial portions on sidewalls of the inner spacers, and a third epitaxial portion in the opening, wherein the first epitaxial portions are thicker than the second epitaxial portions;
   performing an etching process on the first epitaxial layer;
   forming a second epitaxial layer on the first epitaxial layer; and
   forming a third epitaxial layer on the second epitaxial layer.

2. The method of claim 1, wherein performing the etching process comprises etching the second epitaxial portions to expose the sidewalls of the inner spacers.

3. The method of claim 1, wherein performing the etching process comprises etching the first epitaxial layer prior to forming the second epitaxial layer.

4. The method of claim 1, wherein forming the second epitaxial layer comprises forming the second epitaxial layer in contact with the first and third epitaxial portions and the sidewalls of the inner spacers.

5. The method of claim 1, wherein performing the etching process comprises etching the third epitaxial portion prior to forming the second epitaxial layer.

6. The method of claim 1, further comprising etching the second epitaxial layer prior to forming the third epitaxial layer.

7. The method of claim 1, wherein forming the first epitaxial layer comprises forming the first and third epitaxial portions with crystal orientations different from each other.

8. The method of claim 1, further comprising forming an oxide layer on the stack of first and second semiconductor layers and in contact with one of the first epitaxial portions.

9. The method of claim 1, further comprising:
doping the first epitaxial layer with a first dopant concentration; and
doping the second epitaxial layer with a second dopant concentration higher than the first dopant concentration.

10. The method of claim 1, further comprising replacing the first semiconductor layers with gate structures.

11. A method, comprising:
forming first and second nanostructured layers on a fin base;
forming an inner spacer on a sidewall of the first nanostructured layer;
forming a source/drain region, comprising:
forming an epitaxial end cap with a first crystal orientation on a sidewall of the second nanostructured layer and on a sidewall of the inner spacer;
forming, in the fin base, an epitaxial base with a second crystal orientation different from the first crystal orientation;
forming an epitaxial layer on the epitaxial end cap, the epitaxial base, and the sidewall of the inner spacer; and
forming an epitaxial top cap on the epitaxial layer.

12. The method of claim 11, wherein forming the epitaxial end cap comprises:
forming an other epitaxial layer with a first epitaxial portion on the sidewall of the second nanostructured layer and a second epitaxial portion on the sidewall of the inner spacer; and
etching the second epitaxial portion to expose the sidewall of the inner spacer.

13. The method of claim 11, wherein forming the epitaxial base comprises:
etching the fin base to form an opening; and
growing an other epitaxial layer in the opening.

14. The method of claim 11, further comprising:
doping the epitaxial base with a first dopant concentration; and
doping the epitaxial layer with a second dopant concentration higher than the first dopant concentration.

15. The method of claim 11, further comprising forming an oxide layer on the second nanostructured layer and in contact with the epitaxial end cap.

16. The method of claim 11, further comprising etching the epitaxial layer prior to forming the epitaxial top cap.

17. A semiconductor device, comprising:
a nanostructured layer disposed on a fin base;
a gate structure surrounding the nanostructured layer;
an inner spacer disposed on a sidewall of the gate structure;
a source/drain region, comprising:
an epitaxial end cap with a first crystal orientation disposed on a sidewall of the nanostructured layer and on a sidewall of the inner spacer;
an epitaxial base with a second crystal orientation different from the first crystal orientation disposed in the fin base;
an epitaxial layer disposed on the epitaxial end cap, the epitaxial base, and the sidewall of the inner spacer; and
an epitaxial top cap disposed on the epitaxial layer.

18. The semiconductor device of claim 17, further comprising an oxide layer disposed on the nanostructured layer and in contact with the epitaxial end cap.

19. The semiconductor device of claim 17, wherein the epitaxial base is in contact with the inner spacer.

20. The semiconductor device of claim 17, wherein the epitaxial end cap comprises a crescent-shaped cross-sectional profile.

* * * * *